(12) United States Patent
Chen et al.

(10) Patent No.: US 10,468,096 B2
(45) Date of Patent: Nov. 5, 2019

(54) ACCELERATED SOFT READ FOR MULTI-LEVEL CELL NONVOLATILE MEMORIES

(71) Applicant: Seagate Technology LLC, Cupertino, CA (US)

(72) Inventors: Zhengang Chen, San Jose, CA (US); Hao Zhong, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 1464 days.

(21) Appl. No.: 13/651,975

(22) Filed: Oct. 15, 2012

(65) Prior Publication Data

US 2014/0104943 A1    Apr. 17, 2014

(51) Int. Cl.
| G06F 12/02 | (2006.01) |
| G11C 11/56 | (2006.01) |
| G11C 16/04 | (2006.01) |

(52) U.S. Cl.
CPC ...... *G11C 11/5642* (2013.01); *G11C 16/0483* (2013.01); *G11C 2211/5634* (2013.01)

(58) Field of Classification Search
CPC ........ G11C 11/5642; G11C 2211/5634; G11C 16/0483
USPC ............................ 365/183.03, 189.011, 233.1
See application file for complete search history.

(56) References Cited

U.S. PATENT DOCUMENTS

| 7,502,254 | B2 | 3/2009 | Murin et al. |
| 7,522,455 | B2 | 4/2009 | Bedarida et al. |
| 7,593,259 | B2 | 9/2009 | Kim |
| 7,966,550 | B2 | 6/2011 | Mokhlesi et al. |
| 8,068,360 | B2 * | 11/2011 | Anholt .................... 365/185.03 |
| 8,385,117 | B2 | 2/2013 | Sakurada et al. |
| 8,964,464 | B2 * | 2/2015 | Weingarten et al. .... 365/185.03 |
| 2009/0106485 | A1 | 4/2009 | Anhold |
| 2010/0223538 | A1 | 9/2010 | Sakurada |

(Continued)

FOREIGN PATENT DOCUMENTS

| EP | 13186583 | 2/2014 |
| JP | 2010205328 A | 9/2010 |

(Continued)

OTHER PUBLICATIONS

J. Wang et al., "Soft Information for LDPC Decoding in Flash: Mutual-Information Optimized Quantization," Global Communications Conference, GLOBECOM, Dec. 2011, pp. 1-6.

*Primary Examiner* — Xiaochun L Chen
(74) *Attorney, Agent, or Firm* — Ryan, Mason & Lewis, LLP (57) ABSTRACT

A memory device includes a memory array comprising multi-level memory cells, and control circuitry coupled to the memory array. The control circuitry is configured to perform accelerated soft read operations on at least a portion of the memory array. A given one of the accelerated soft read operations directed to a non-upper page of the memory array comprises at least one hard read operation directed to a corresponding upper page of the memory array. The given accelerated soft read operation may comprise a sequence of multiple hard read operations including a hard read operation directed to the non-upper page and one or more hard read operations directed to the corresponding upper page.

22 Claims, 4 Drawing Sheets

(56) References Cited

U.S. PATENT DOCUMENTS

2011/0280084 A1* 11/2011 Radke .................... G11C 11/26
                                                        365/185.21
2012/0051144 A1    3/2012 Weingarten et al.
2012/0224420 A1    9/2012 Sakurada et al.

FOREIGN PATENT DOCUMENTS

| JP | 2012181761 A  | 9/2012  |
| WO | 2006071686 A3 | 7/2006  |
| WO | 2007132457 A2 | 11/2007 |

* cited by examiner

ACCELERATED SOFT READ FOR MULTI-LEVEL CELL NONVOLATILE MEMORIES

BACKGROUND

A semiconductor memory device typically includes an array of memory cells arranged in rows and columns, with each memory cell configured to store at least one data bit. Such memories include volatile and nonvolatile memories. Volatile memories require power in order to retain stored data, while nonvolatile memories retain their stored data even after power is removed.

Certain types of nonvolatile memory, such as NAND flash memories, utilize memory cells that are implemented as respective floating gate transistors. Such transistors include both a control gate and a floating gate. Depending on the amount of electric charge on its floating gate, the transistor exhibits a certain threshold voltage (Vt). The corresponding memory cell can therefore be written with data by controlling the amount of charge on the floating gate. To read stored data from the memory cell, a reference voltage (Vref) is applied to the control gate. If Vref is higher than Vt, the transistor is turned on, and otherwise the transistor is turned off. Accordingly, the data stored in the cell can be readily detected by sensing current flow between source and drain terminals of the transistor, typically using a sense amplifier.

In single-level cell (SLC) flash memory, each memory cell stores only one bit of data. Upon readout, for example, those cells having Vt values below Vref may be assumed to store a "1" bit and those having Vt values above Vref may be assumed to store a "0" bit. Due to noise and other variations in the memory array, not all of the memory cells that store bits at a particular logic level will have exactly the same Vt value. Instead, the actual Vt values associated with a given logic level over a group of the memory cells will tend to follow a distribution, such as, for example, a Gaussian distribution. Therefore, in order to read the stored bits from the respective memory cells, the reference voltage Vref may be placed approximately midway between the means of the two different Vt distributions. As noted above, when Vref is applied to the control gates of the memory cell transistors, the transistors having a Vt value lower than Vref will be turned on, indicating storage of a "1" bit in each of the corresponding cells, while the transistors having a Vt value higher than Vref will be turned off, indicating storage of a "0" bit in each of the corresponding cells.

In multi-level cell (MLC) flash memory, each memory cell is able to store multiple bits of data, such as two bits of data in the case of a two-level memory cell, three bits of data in the case of a three-level memory cell, and so on. Thus, for example, in the case of a two-level memory cell storing two bits of data, four different Vt distributions characterize the four different possible combinations of two bits that may be stored in that cell. Each such Vt distribution is associated with a different Vt level. The possible bit combinations are generally mapped to the Vt levels using a Gray code, such that a change from one Vt level to its neighboring Vt level leads to a change in only one bit position.

Reading out stored data from such multi-level cells involves using multiple reference voltages. For example, in the two-level memory cell case, three different reference voltages are used, arranged between the four different Vt levels. Determining the data stored in a given cell may also involve the use of soft read operations, each comprising multiple hard read operations using a different reference voltage.

However, conventional soft read operations can require an excessive number of hard read operations. As a result, soft read latency is increased, thereby degrading memory access time performance. In conventional practice, therefore, a significant performance penalty is typically associated with performance of soft read operations.

SUMMARY

Embodiments of the invention provide, for example, an MLC memory device in which soft read operations directed to non-upper pages of a memory array are accelerated using corresponding upper page hard read operations. Such upper page hard read operations may be performed utilizing predetermined commands established by a vendor of the memory array but not otherwise normally utilized for soft read operations. The accelerated soft read operations can each be performed using fewer hard read operations, and therefore with significantly reduced latency. This tends to minimize the performance penalty typically associated with conventional soft read operations.

It should be noted that the term "multi-level cell" or MLC as used herein is intended to be broadly construed so as to encompass not only a memory cell that stores two bits of data, but more generally any memory cell that stores two or more bits of data, including a three-level memory cell that stores three bits of data, a four-level memory cell that stores four bits of data, and so on.

In addition, the term "upper page" is also intended to be broadly construed, as a relative term, so as to encompass, for example, any page that is considered "above" another page that is subject to a soft read operation. Thus, for example, in the case of three-level memory cells used to form upper, middle and lower pages of a memory array, the middle page may be considered an upper page relative to the lower page, and the upper page may be considered an upper page relative to the middle page or the lower page. Accordingly, if the page that requires soft read is the lower page, an accelerated soft read operation can utilize hard read operations for either the middle page or the upper page.

In one embodiment, a memory device includes a memory array comprising multi-level memory cells, and control circuitry coupled to the memory array. The control circuitry is configured to perform accelerated soft read operations on at least a portion of the memory array. A given one of the accelerated soft read operations directed to a non-upper page of the memory array comprises at least one hard read operation directed to a corresponding upper page of the memory array.

By way of example, the given accelerated soft read operation may comprise a sequence of multiple hard read operations including a hard read operation directed to the non-upper page and one or more hard read operations directed to the corresponding upper page.

The non-upper page may comprise a first portion of a set of bits for a particular row or other designated group of the multi-level memory cells and the upper page may comprise a second portion of the set of bits for that group. For example, the non-upper page may comprise least significant bits for a particular row or other designated group of the multi-level memory cells and the upper page may comprise most significant bits for that group, or vice versa. Other types of correspondence may exist between upper, middle or lower pages and respective portions of a set of bits for a designated group of the multi-level memory cells.

One or more of the embodiments can provide an MLC memory device that exhibits shorter soft read latency and therefore improved overall operating performance relative to conventional devices, through the use of a controller or other control circuitry configured as disclosed herein.

An MLC memory device comprising a controller or other control circuitry in accordance with embodiments of the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices and associated controllers that are configured to provide accelerated soft read functionality. It should be understood, however, that embodiments of the invention are more generally applicable to any semiconductor memory device with multi-level cells in which improvements in read performance are desired, and may be implemented using circuitry other than that specifically shown and described in conjunction with the disclosed embodiments. For example, although described herein primarily in the context of nonvolatile memories, certain aspects of one or more embodiments may be adaptable for use with volatile memories.

Figure 1:
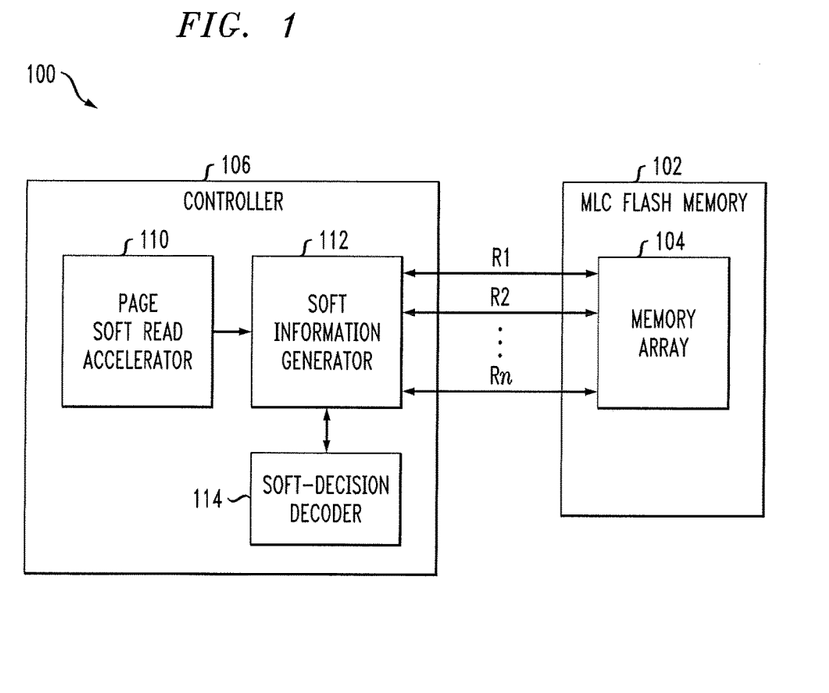
FIG. 1 is a block diagram of a semiconductor memory device comprising a multi-level cell memory array and an associated controller configured to provide accelerated soft read functionality in an embodiment of the invention.

FIG. 1 shows a block diagram of a memory device 100 in accordance with an embodiment of the invention. The memory device 100 comprises a multi-level cell (MLC) flash memory 102 that includes a memory array 104 that includes a plurality of multi-level cells. The memory device 100 further comprises a controller 106 coupled to the MLC flash memory 102. As noted above, the term multi-level cell or MLC as used herein is intended to encompass not only a memory cell that stores two bits of data, but more generally any memory cell that stores two or more bits of data, including a three-level memory cell that stores three bits of data, a four-level memory cell that stores four bits of data, and so on.

The multi-level cells of the memory array 104 are generally arranged in rows and columns, with each cell in a given row being coupled to a common wordline and each cell in a given column being coupled to a common bitline. The memory array may therefore be viewed as including a memory cell at each point where a wordline intersects with a bitline. The memory cells of the memory array may be illustratively arranged in N columns and M rows. The values selected for N and M in a given implementation will generally depend upon on the data storage requirements of the application in which the memory device is utilized. In some embodiments, one of N and M may have value 1, resulting in an array comprising a single column or a single row of memory cells.

Particular ones of the memory cells of the memory array 104 can be activated for writing data thereto or reading data therefrom by application of appropriate row and column addresses to respective row decoder and column decoder elements. Other elements associated with reading and writing of the memory array 104 may include sense amplifiers and input and output data buffers. The sense amplifiers may comprise, for example, differential sense amplifiers coupled to respective columns of the memory array 104, although other types of sensing circuitry may be used. The operation of these and other memory device elements is well understood in the art and will not be described in detail herein.

Although illustrated as part of the MLC flash memory 102 in the FIG. 1 embodiment, the memory array 104 may be implemented using other types of memory in other embodiments of the invention. Moreover, the controller 106, although illustrated as being separate from the MLC flash memory 102 in FIG. 1, may instead be at least partially incorporated into the MLC flash memory 102 in other embodiments.

It should be noted that the term "memory array" as used herein is intended to be broadly construed, and may encompass not only the multi-level cells but also one or more associated elements such as row and column decoders, sensing circuitry, input and output data buffers or other memory device elements, including one or more elements of the controller 106, in any combination. In addition, wordlines and bitlines in the memory array 104 may be implemented as respective pairs of differential lines. Also, separate read and write wordlines or bitlines may be used, and a given such read or write wordline or bitline may comprise a corresponding pair of differential lines.

The memory array 104 in the present embodiment comprises at least one upper page and at least one non-upper page. As mentioned previously, the term "upper page" as used herein is intended to be broadly construed as a relative term, so as to encompass, for example, any page that is considered "above" another page that is subject to a soft read operation, such that in the case of three-level memory cells used to form upper, middle and lower pages of a memory array, the middle page may be considered an upper page relative to the lower page, and the upper page may be considered an upper page relative to both the middle page and the lower page. Similarly, the term "non-upper page" is intended to be broadly construed as a relative term, so as to encompass, for example, any page that is considered "below" an upper page, such as a middle page or a lower page in the case of three-level memory cells.

The controller 106 may be viewed as an example of what is more generally referred to herein as "control circuitry" coupled to a memory array. Such control circuitry is configured to perform accelerated soft read operations on at least a portion of the memory array, as will be described in greater detail below.

At least a given one of the accelerated soft read operations performed by the controller 106 in the present embodiment and directed to a non-upper page of the memory array 104 comprises at least one hard read operation directed to a corresponding upper page of the memory array 104. The given accelerated soft read operation may comprise a sequence of multiple hard read operations including a hard read operation directed to the non-upper page and one or more hard read operations directed to the corresponding upper page. A given hard read operation directed to the corresponding upper page will generally have multiple voltage reference values associated therewith.

Multiple hard read operations carried out by the soft information generator 112 on the memory array 104 are designated by arrows denoted R1, R2, . . . Rn in the figure.

The non-upper page in the memory array 104 may comprise a first portion of a set of bits for a particular row or other designated group of the multi-level memory cells and the upper page may comprise a second portion of the set of bits for that group. For example, the non-upper page may comprise least significant bits for a particular row or other designated group of the multi-level memory cells and the upper page may comprise most significant bits for that group, or vice versa. Other types of correspondence may exist between upper, middle or lower pages and respective portions of a set of bits for a designated group of the multi-level memory cells.

The controller 106 in the present embodiment comprises a page soft read accelerator 110 configured to specify a sequence of hard read operations to be performed as part of the given accelerated soft read operation, a soft information generator 112 configured to perform the specified sequence of hard read operations to obtain soft information for the accelerated soft read operation, and a soft-decision error correction code (ECC) decoder 114 coupled to the soft information generator 112 and configured to generate a read output decision based on the soft information obtained for the accelerated soft read operation. Other types of soft-decision decoders may be used in other embodiments.

The present embodiment of memory device 100 is configured to avoid one or more of the drawbacks of conventional practice through the use of controller 106 that is configured to accelerate soft read operations directed to non-upper pages of the memory array 104 using corresponding upper page hard read operations. Such upper page hard read operations may be performed utilizing predetermined commands established by a vendor of the memory array 104 but not otherwise normally utilized for soft read operations. The accelerated soft read operations can each be performed using fewer hard read operations, and therefore with significantly reduced latency. This tends to minimize the performance penalty typically associated with conventional soft read operations.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

The operation of the memory device 100 will now be described in greater detail with reference to FIGS. 2 through 4, which more particularly relate to an embodiment in which memory array 104 is implemented using two-level memory cells, and FIGS. 5 through 7, which more particularly relate to an embodiment in which memory array 104 is implemented using three-level memory cells.

Figure 2:
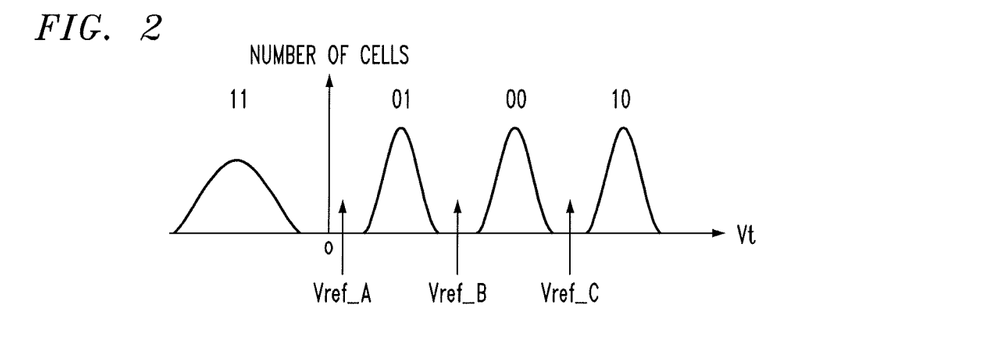
FIG. 2 is a plot of number of cells as a function of threshold voltage in a two-level memory cell embodiment of the FIG. 1 memory device.

Referring now to FIG. 2, a plot is shown of number of cells as a function of threshold voltage Vt in a two-level memory cell embodiment of the FIG. 1 memory device 100. Each two-level memory cell stores one of four different possible combinations of two data bits, namely, 11, 10, 00 and 10. As indicated previously herein, in the case of two-level memory cells, four different Vt distributions characterize the four different possible combinations of two bits that may be stored in the cells, with each such Vt distribution being associated with a different Vt level. The possible bit combinations are generally mapped to the Vt levels using a Gray code, such that a change from one Vt level to its neighboring Vt level leads to a change in only one bit position.

Reading out stored data from such multi-level cells involves using multiple reference voltages. For example, in the two-level memory cell case illustrated in FIG. 2, three different reference voltages Vref_A, Vref_B and Vref_C are used, arranged between the four different Vt levels corresponding to the respective bit combinations 11, 01, 00 and 10.

In the FIG. 2 embodiment, a variety of different paging arrangements may be used. For example, the most significant bits (MSBs) from all of the two-level cells in a given wordline of the memory array 104 may be organized into one page, referred to as an MSB page, with the least significant bits (LSBs) from all of the two-level cells in the given wordline of the memory array being organized into another page, referred to as an LSB page. In such an arrangement, in order to read the LSB page bits, Vref_B is utilized, and in order to read the MSB page bits, multiple voltage references Vref_A and Vref_C are utilized. Both the LSB and MSB readouts in this case are hard decision bits.

It should be noted that the Gray mapping used in FIG. 2 is just an example, and other types of mappings can be used. For example, another Gray mapping could be achieved by swapping the LSBs and MSBs of the four possible bit combinations in the figure. Thus, the term "lower page" in this two-level cell case may refer to the LSBs or MSBs that can be read utilizing only one reference voltage, and the term "upper page" may refer to the LSBs or MSBs that are read utilizing multiple reference voltages. As mentioned previously, numerous other paging arrangements are possible in other embodiments.

Soft read operations are used in MLC memories in order to provide improved readout reliability. A given soft read operation generally comprises multiple hard read operations typically using different reference voltages.

Figure 3:
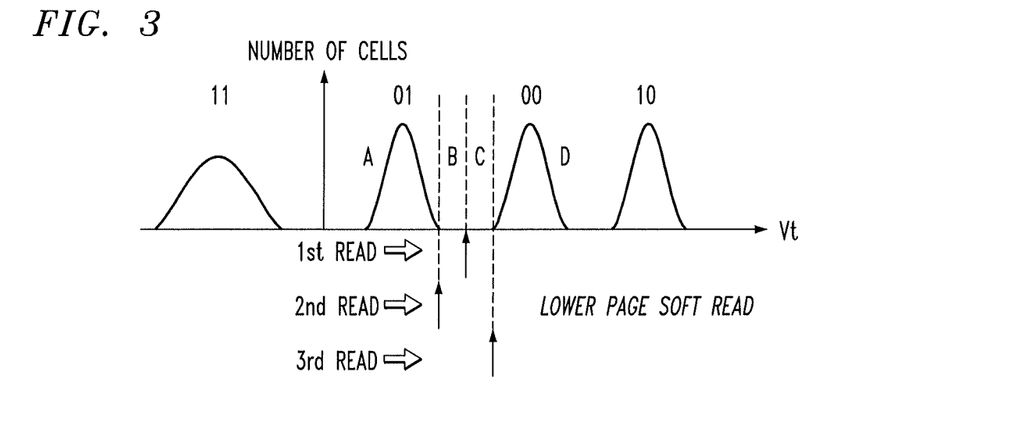
FIG. 3 illustrates a lower page soft read without acceleration in the FIG. 2 embodiment.

FIG. 3 shows an example of a lower page soft read operation without acceleration. The lower page soft read operation in this example uses three different hard read operations, each performed utilizing a different reference voltage. The entire Vt range is divided into 4 regions, denoted A, B, C, and D. The first hard read utilizes an initial Vref_B value, and the second and third hard reads may be viewed as being performed utilizing respective adjusted values of Vref_B, one being lower than the initial value used in the first hard read and one greater than the initial value, as indicated in the figure. Based on the resulting hard decision outputs, as summarized in Table 1 below, the lower page data stored in the two-level cells can be readily determined.

TABLE 1

Lower Page Soft Read without Acceleration

| Vt region | 1st read HD bit | 2nd read HD bit | 3rd read HD bit | Description of lower page soft info |
|---|---|---|---|---|
| A | 1 | 1 | 1 | Strong "1" |
| B | 1 | 0 | 1 | Weak "1" |
| C | 0 | 0 | 1 | Weak "0" |
| D | 0 | 0 | 0 | Strong "0" |

Soft information generated from multiple hard reads as in the above example is used by the soft-decision ECC decoder 114 of controller 106 in order to improve readout reliability as noted above.

As mentioned above, the FIG. 3 example is an arrangement that does not utilize soft read acceleration and accordingly does not involve use of the page soft read accelerator 110 of the controller 106.

Figure 4:
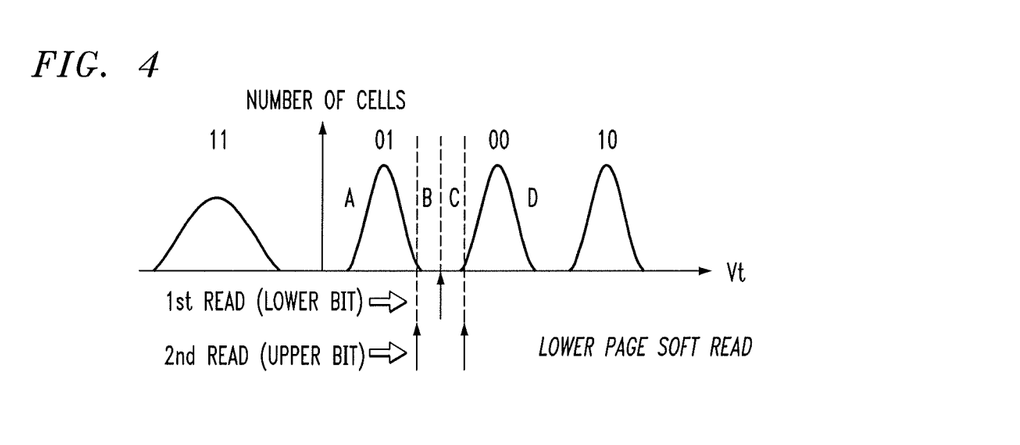
FIG. 4 illustrates a lower page soft read with acceleration in the FIG. 2 embodiment.

Referring now to FIG. 4, an example of a lower page soft read operation with acceleration is shown. In this example, the lower page soft read operation more particularly comprises a first hard read operation directed to a lower page, and a second hard read operation directed to an upper page. The first hard read operation is used to read the lower page bits, illustratively the LSBs in this example, using reference voltage Vref_B as in the FIG. 3 example. However, the second and third hard read operations in the FIG. 3 example are replaced in the FIG. 4 example with a single hard read operation directed to the upper page, illustratively comprising the MSBs. The single hard read operation directed to the upper page in FIG. 4 is performed using adjusted values of Vref_A and Vref_C as indicated in the figure. Typically, MLC memories are configured with reference voltage adjustability that can be utilized in embodiments of the invention.

Table 2 below summarizes the soft information that is generated by performance of the accelerated soft read operation of FIG. 4. It can be seen that the amount of soft information generated in the FIG. 4 example is the same as that which is generated using three lower page hard reads in FIG. 3.

TABLE 2

Lower Page Soft Read with Acceleration

| Vt region | 1st read HD bit (lower page) | 2nd read HD bit (upper page) | Description of lower page soft info |
|---|---|---|---|
| A | 1 | 1 | Strong "1" |
| B | 1 | 0 | Weak "1" |
| C | 0 | 0 | Weak "0" |
| D | 0 | 1 | Strong "0" |

The soft read acceleration illustrated in the two-level cell example of FIG. 4 provides a significant reduction in soft read latency and therefore improved overall operating performance in the memory device 100 relative to conventional devices. The soft read latency in one or more embodiments may be characterized as comprising read time (tR) and transfer time (tXFR), where the read time tR is the time that the MLC flash memory 102 takes to read an entire page and store it in an internal page buffer, and the transfer time tXFR is the time that the MLC flash memory 102 takes to transfer at least a portion of the read page to the controller 106 for soft-decision ECC decoding. In the FIG. 4 example, tR for an upper page hard read is larger than tR for a lower page hard read, as the upper page hard read utilizes two different reference voltages, but generally tR(upper)<2*tR(lower).

Accelerated soft read as illustrated in FIG. 4 reduces latency in both read time tR and transfer time tXFR, as shown in Table 3 below. Note that this table does not consider cached reads or pipelining, which may be utilized in other embodiments of the invention.

TABLE 3

Latency Comparison with and without Soft Read Acceleration

| # of hard reads in soft read for lower pages | # of lower page reads + # of upper page reads without acceleration | Latency without acceleration | # of lower page reads + # of upper page reads with acceleration | Latency with acceleration |
|---|---|---|---|---|
| 2 | 2 + 0 | 2*(tR(lower) + tXFR) | 0 + 1 | tR(upper) + tXFR |
| 3 | 3 + 0 | 3*(tR(lower) + tXFR) | 1 + 1 | tR(lower) + tR(upper) + 2*tXFR |
| 4 | 4 + 0 | 4*(tR(lower) + tXFR) | 0 + 2 | 2*tR(upper) + 2*tXFR |
| 5 | 5 + 0 | 5*(tR(lower) + tXFR) | 1 + 2 | tR(lower) + 2*tR(upper) + 3*tXFR |
| 6 | 6 + 0 | 6*(tR(lower) + tXFR) | 0 + 3 | 3*tR(upper) + 3*tXFR |
| 7 | 7 + 0 | 7*(tR(lower) + tXFR) | 1 + 3 | tR(lower) + 3*tR(upper) + 4*tXFR |

Assuming tR(upper)<2*tR(lower), the latency with acceleration is always lower than the latency without acceleration for this lower page soft read example. Similar improvements are achieved with other types of accelerated soft read operations.

Figure 5:
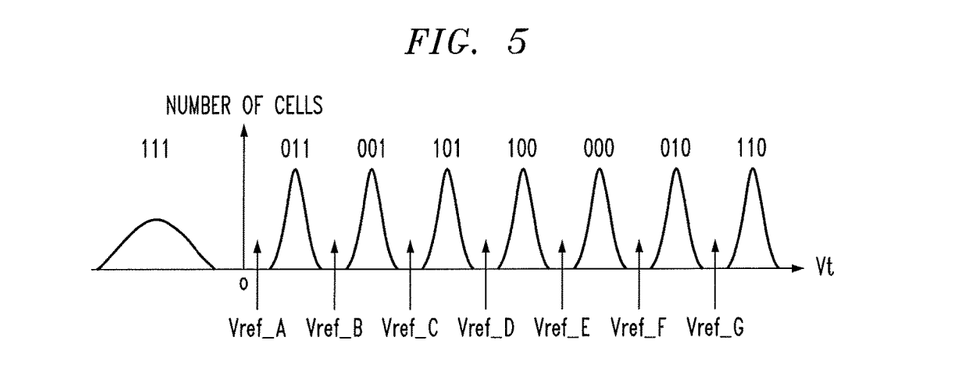
FIG. 5 is a plot of number of cells as a function of threshold voltage in a three-level memory cell implementation of the FIG. 1 memory device.

FIG. 5 shows a plot of number of cells as a function of threshold voltage Vt in a three-level memory cell embodiment of the FIG. 1 memory device 100. Each three-level memory cell stores one of eight different possible combinations of three data bits, namely, 111, 011, 001, 101, 100, 000, 010, 110. In the case of three-level memory cells, eight different Vt distributions characterize the eight different possible combinations of three bits that may be stored in the cells, with each such Vt distribution being associated with a different Vt level. The possible bit combinations are generally mapped to the Vt levels using a Gray code, such that a change from one Vt level to its neighboring Vt level leads to a change in only one bit position. One example of such a Gray code mapping is illustrated in the ordering of the bit combinations from left to right in the figure.

Reading out stored data from such three-level cells involves using seven different reference voltages Vref_A, Vref_B, Vref_C, Vref_D, Vref_E, Vref_F and Vref_G, arranged between the eight different Vt levels corresponding to the respective bit combinations 111, 011, 001, 101, 100, 000, 010, 110.

Figure 6:
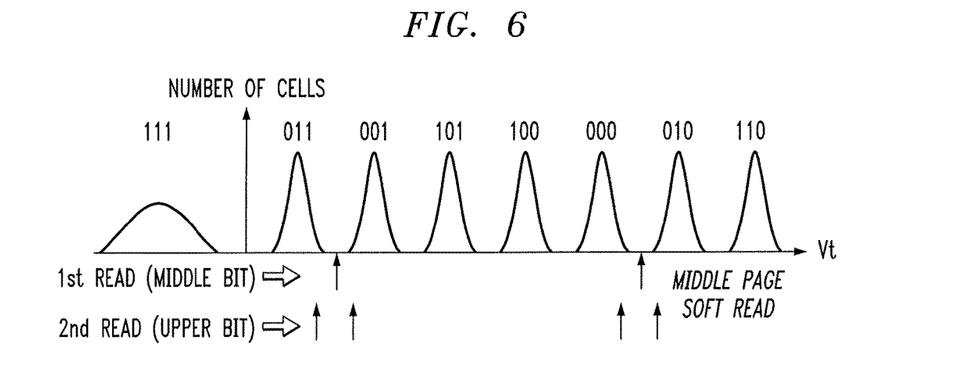
FIG. 6 illustrates a middle page soft read with acceleration in the FIG. 5 embodiment.

Referring now to FIG. 6, an example of a middle page soft read operation with acceleration is shown for the three-level cell embodiment of FIG. 5. In this example, the middle page soft read operation more particularly comprises a first hard read operation directed to a middle page, and a second hard read operation directed to an upper page.

Figure 7:
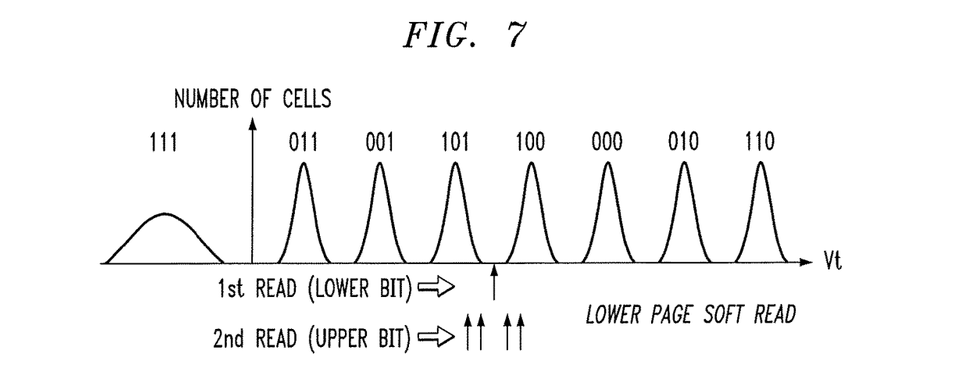
FIG. 7 illustrates a lower page soft read with acceleration in the FIG. 5 embodiment.

FIG. 7 shows an example of a lower page soft read operation with acceleration for the three-level cell embodiment of FIG. 5. In this example, the lower page soft read operation more particularly comprises a first hard read operation directed to a lower page, and a second hard read operation directed to an upper page. The "upper page" in this example may comprise the actual upper page or the middle page. In these and other examples herein, the second hard read operation directed to the upper page may be extended using second, third, fourth or even more hard read operations.

The examples of FIGS. 6 and 7 each obtain the same amount of soft information as five lower page hard reads.

The page soft read accelerator 110 operates in conjunction with the soft information generator 112 to generate multiple hard reads R1, R2, . . . Rn to the memory array 104 in order to perform the accelerated soft read operations illustrated in FIGS. 4, 6 and 7. As indicated previously, this may involve adjustment of one or more reference voltage values when performing particular hard reads directed to upper or non-upper pages. At least a portion of the each of the modules 110, 112 and 114 of the controller 106 may be implemented in the form of software that is stored in a memory and executed by a processor. The term "control circuitry" as used herein should therefore be understood to encompass a processing device or portion of such a device that comprises such memory and processor elements. The memory element or elements used in this regard may be considered examples of processor-readable storage media storing executable program code for implementing certain functionality of memory device 100 in one or more embodiments.

It is to be appreciated that the particular controller configuration illustrated in FIG. 1 and the associated accelerated soft read operations illustrated in FIGS. 4, 6 and 7 are presented by way of illustrative example only, and other embodiments may use other types and arrangements of control circuitry and accelerated soft read operations. The term "control circuitry" as used herein is therefore intended to be broadly construed, and should not be viewed as being limited to the particular arrangements shown and described in conjunction with any particular embodiments.

A given memory device configured in accordance with an embodiment of the invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 8:
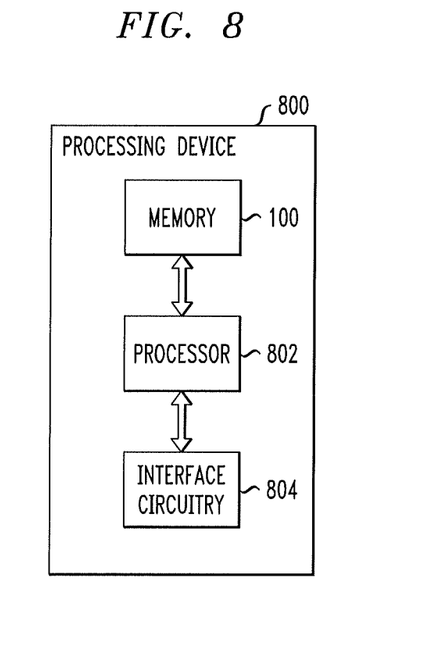
FIG. 8 is a block diagram of a processing device which incorporates the memory device of FIG. 1.

FIG. 8 shows an embodiment of a processing device 800 which incorporates the memory device 100 of FIG. 1. In this embodiment, the memory device 100 is coupled to a processor 802. The processing device further includes interface circuitry 804 coupled to the processor 802. The processing device 800 may comprise, for example, a computer, a server or a portable communication device such as a mobile telephone. The interface circuitry 804 may comprise one or more transceivers for allowing the device 800 to communicate over a network.

Figure 9:
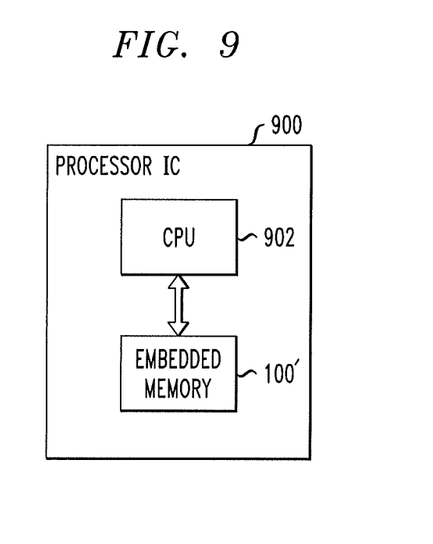
FIG. 9 is a block diagram of a processor integrated circuit which incorporates the memory device of FIG. 1 as an embedded memory.

Alternatively, processing device 800 may comprise a microprocessor, DSP or ASIC, with processor 802 corresponding to a central processing unit (CPU) and memory device 100 providing at least a portion of an embedded memory of the microprocessor, DSP or ASIC. FIG. 9 shows an example of an arrangement of this type, with processor integrated circuit 900 incorporating the memory device of FIG. 1 as an embedded memory 100'. The embedded memory 100' in this embodiment is coupled to a CPU 902. The embedded memory may comprise, for example, an MLC flash memory. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with a memory array and associated control circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, multi-level cells, control circuitry, memory page configurations, soft read operations, reference voltage signals, and other elements for implementing the described functionality. These and numerous other alternative embodiments within the scope of the following claims will be apparent to those skilled in the art.

What is claimed is:

1. A memory device comprising:
a memory array comprising a plurality of multi-level memory cells; and
control circuitry coupled to the memory array and configured to perform accelerated soft read operations on at least a portion of the memory array;
wherein a given one of the accelerated soft read operations directed to a non-upper page of the memory array comprises a lower page soft read operation, wherein the lower page soft read operation comprises a sequence of multiple hard read operations, the sequence of multiple hard read options comprising a first hard read operation directed to the non-upper page of the memory array, and at least a second hard read operation directed to a corresponding upper page of the memory array;
wherein a read output decision for the given accelerated soft read operation directed to the non-upper page of the memory array is based on upper page soft information obtained at least in part from the second hard read operation directed to the corresponding upper page of the memory array;
wherein the upper page soft information comprises information indicating a strength of a result obtained from the first hard read operation directed to the non-upper page of the memory array; and
wherein the second hard read operation directed to the corresponding upper page of the memory array comprises a hard read of the upper page of the memory array.

2. The memory device of claim 1 wherein the second hard read operation directed to the corresponding upper page has multiple voltage reference values associated therewith.

3. The memory device of claim 1 wherein the second hard read operation directed to the corresponding upper page is performed utilizing a predetermined command established by a vendor of the memory array.

4. The memory device of claim 1 wherein the control circuitry comprises:

a soft read accelerator configured to specify the sequence of hard read operations to be performed as part of the given accelerated soft read operation;
a soft information generator configured to perform the specified sequence of hard read operations to obtain the soft information for the accelerated soft read operation; and
a soft-decision error correction code decoder coupled to the soft information generator and configured to generate the read output decision based on the soft information obtained for the accelerated soft read operation.

5. The memory device of claim 1 wherein the multi-level memory cells comprise two-level memory cells each storing two bits of data.

6. The memory device of claim 1 wherein the multi-level memory cells comprise three-level memory cells each storing three bits of data.

7. The memory device of claim 6 wherein the given accelerated soft read operation comprises one of a middle page soft read operation and a lower page soft read operation.

8. The memory device of claim 7 wherein the middle page soft read operation comprises:
a first hard read operation directed to a middle page; and
at least one additional hard read operation directed to an upper page.

9. The memory device of claim 7 wherein the lower page soft read operation comprises:
the first hard read operation directed to a lower page; and
at least one additional hard read operation directed to an upper page.

10. The memory device of claim 7 wherein the lower page soft read operation comprises:
the first hard read operation directed to a lower page; and
at least one additional hard read operation directed to a middle page.

11. The memory device of claim 1 wherein the non-upper page comprises a first portion of a set of bits for a designated group of the multi-level memory cells and the upper page comprises a second portion of the set of bits for the designated group of multi-level memory cells.

12. The memory device of claim 11 wherein the designated group comprises a designated row of the multi-level memory cells.

13. An integrated circuit comprising the memory device of claim 1.

14. A processing device comprising the memory device of claim 1.

15. The memory device of claim 1 wherein the given accelerated soft read operation directed to the non-upper page of the memory array comprises:
obtaining at least one hard decision value for the corresponding upper page; and
utilizing the at least one hard decision value to generate the upper page soft information.

16. The memory device of claim 1 wherein the second hard read operation directed to the corresponding upper page of the memory array:
utilizes at least a first pair of reference voltages;
returns a first value if a threshold voltage is between the first pair of reference voltages; and
returns a second value different than the first value if the threshold voltage is outside the first pair of reference voltages.

17. The memory device of claim 16 wherein:
the first hard read operation directed to the non-upper page of the memory array utilizes a first reference voltage; and
the first pair of reference voltages comprises a second reference voltage lower than the first reference voltage and a third reference voltage higher than the first reference voltage.

18. A method comprising:
determining one or more accelerated soft read operations to be performed on at least a portion of a memory array comprising a plurality of multi-level memory cells; and
performing at least a given one of the accelerated soft read operations;
wherein the given accelerated soft read operation is directed to a non-upper page of the memory array and comprises a lower page soft read operation, wherein the lower page soft read operation comprises a sequence of multiple hard read operations, the sequence of multiple hard read options comprising a first hard read operation directed to the non-upper page of the memory array, and at least a second hard read operation directed to a corresponding upper page of the memory;
wherein a read output decision for the given accelerated soft read operation directed to the non-upper page of the memory array is based on soft information obtained at least in part from the second hard read operation directed to the corresponding upper page of the memory array;
wherein the upper page soft information comprises information indicating a strength of a result obtained from the first hard read operation directed to the non-upper page of the memory array; and
wherein the second hard read operation directed to the corresponding upper page of the memory array comprises a hard read of the upper page of the memory array.

19. The method of claim 18 wherein the second hard read operation directed to the corresponding upper page of the memory array:
utilizes at least a first pair of reference voltages;
returns a first value if a threshold voltage is between the first pair of reference voltages; and
returns a second value different than the first value if the threshold voltage is outside the first pair of reference voltages.

20. An apparatus comprising:
control circuitry adapted for coupling to a memory array comprising a plurality of multi-level memory cells;
the control circuitry being configured to perform accelerated soft read operations on at least a portion of the memory array;
wherein a given one of the accelerated soft read operations directed to a non-upper page of the memory array comprises a lower page soft read operation, wherein the lower page soft read operation comprises a sequence of multiple hard read operations, the sequence of multiple hard read options comprising a first hard read operation directed to the non-upper page of the memory array, and at least a second hard read operation directed to a corresponding upper page of the memory array;
wherein a read output decision for the given accelerated soft read operation directed to the non-upper page of the memory array is based on soft information obtained at least in part from the second hard read operation directed to the corresponding upper page of the memory array;

wherein the upper page soft information comprises information indicating a strength of a result obtained from the first hard read operation directed to the non-upper page of the memory array; and wherein the second hard read operation directed to the corresponding upper page of the memory array comprises a hard read of the upper page of the memory array.

21. The apparatus of claim 20 wherein the control circuitry comprises:
   a soft read accelerator configured to specify the sequence of hard read operations to be performed as part of the given accelerated soft read operation;
   a soft information generator configured to perform the specified sequence of hard read operations to obtain the soft information for the accelerated soft read operation; and
   a soft-decision error correction code decoder coupled to the soft information generator and configured to generate the read output decision based on the soft information obtained for the accelerated soft read operation.

22. The apparatus of claim 20 wherein the second hard read operation directed to the corresponding upper page of the memory array:
   utilizes at least a first pair of reference voltages;
   returns a first value if a threshold voltage is between the first pair of reference voltages; and
   returns a second value different than the first value if the threshold voltage is outside the first pair of reference voltages.

* * * * *